United States Patent [19]

Steigerwald

[11] 3,928,775

[45] Dec. 23, 1975

[54] TURN-OFF CIRCUIT FOR GATE TURN-OFF THYRISTORS AND TRANSISTORS USING SNUBBER ENERGY

[75] Inventor: Robert L. Steigerwald, Scotia, N.Y.

[73] Assignee: General Electric Company, Schenectady, N.Y.

[22] Filed: June 20, 1974

[21] Appl. No.: 481,147

[52] U.S. Cl. .......................... 307/252 C; 307/252 M

[51] Int. Cl.² .......................... H03K 17/60

[58] Field of Search ..... 307/252 C, 252 M; 331/111

[56] References Cited

UNITED STATES PATENTS 3,197,716 7/1965 Wright et al. .......................... 331/111

3,622,806 11/1971 Williams .......................... 307/252 C X

*Primary Examiner*—James B. Mullins

*Attorney, Agent, or Firm*—Donald R. Campbell; Joseph T. Cohen; Jerome C. Squillaro

[57] ABSTRACT

An efficient and economical turn-off circuit for a gate turn-off thyristor, transistor, or other semiconductor device, recovers the energy stored in a polarized snubber circuit used to limit reapplied dv/dt, and utilizes the recovered energy to generate a turn-off control current pulse. An additional winding can be added to the inductive energy storage component in the turn-off circuit to return excess energy to the supply.

6 Claims, 15 Drawing Figures

TURN-OFF CIRCUIT FOR GATE TURN-OFF THYRISTORS AND TRANSISTORS USING SNUBBER ENERGY

BACKGROUND OF THE INVENTION

This invention relates to turn-off circuits for power semiconductors such as the gate turn-off thyristor and the transistor, and more particularly to turn-off circuits using the energy stored in a snubber circuit to generate a turn-off control current pulse.

The gate turn-off thyristor (GTO) is a reverse blocking triode thyristor similar to the ordinary SCR in that the device is triggered into conduction by the application of a gating pulse which injects current into the gate lead, but dissimilar in that the anode current is turned off by a reverse gate pulse which withdraws current from the gate lead. Due to the regenerative nature of the GTO device, rather large reverse gate pulses are required, particularly for the high power devices presently being developed. The magnitude of these turn-off pulses may be as low as 10 percent of the anode current to as high as 100 percent of the anode current, and presents a problem as to generating such large pulses with the requirement of a high current source and a method of coupling to the gate lead.

In practice, a snubber circuit is connected between the anode and cathode of the GTO device to reduce turn-off power dissipation and limit the rate of rise of reapplied voltage. Upon the application of the reverse gate pulse, the undiminished load current tends to squeeze in a lateral direction under the emitter region, and unless a snubber is used high voltage and high current density conditions would exist simultaneously during turn-off leading to high peak power dissipation. During the anode current fall time, load current is shunted into the snubber capacitor and the rate at which the anode voltage rises is limited to thereby reduce the peak power dissipation. The snubber also prevents retriggering of the device due to excessive reapplied *dv/dt*. However, the charged snubber capacitor contains energy which is commonly discharged through a series connected snubber resistor during the next cycle of conduction and generates heat as well as increasing the turn-on switching duty.

The foregoing comments apply as well to the power transistor, where there is a need to assure proper operation by applying an opposite polarity base drive signal during the non-conducting intervals, and to use a snubber circuit connected between collector and emitter having provision for dissipating the cyclically stored snubber energy. As the device power ratings increase, these considerations become more pressing in power semiconductors of this type. Hereafter the anode and cathode of a GTO device and the emitter and collector of a transistor are also referred to as the load terminals, while the gate and base electrodes of the respective devices are also referred to as the control terminal.

SUMMARY OF THE INVENTION

In accordance with the invention, a semiconductor device of the type having a pair of load terminals and a control terminal, such as a gate turn-off thyristor or transistor, is provided with a turn-off circuit which utilizes the stored snubber circuit energy to selectively provide a turn-off control current pulse which is applied to the control terminal to achieve switching to the non-conducting state in which voltage is blocked. The snubber circuit connected between the load terminals for the reasons previously mentioned is suitably a polarized snubber comprising only a diode and the snubber capacitor in series. In the turn-off circuit, an inductive energy storage component or other means is used to first recover the stored snubber capacitor energy and then generate the turn-off pulse, with the result that the snubber capacitor is conditioned for a new cycle of operation when the turn-off pulse is applied. The snubber capacitor has multiple functions and the circuit for some loads desirably produces a variable magnitude turn-off pulse depending on the load current. Efficient and economical operation is achieved so as to be suitable for high frequency power conversion.

In one embodiment, a series resonant circuit controlled by a solid state switch transfers the snubber capacitor energy to an inductor, whose discharge forward biases a blocking diode and generates the turn-off control current pulse. Excess energy is dissipated by a resistor or other impedance connected between the control terminal and one load terminal, with the modification that a portion of the excess energy can be returned to a supply by an additional transformer-coupled inductor winding. In another embodiment permitting impedance matching, the snubber capacitor energy is transferred to the primary winding of a transformer, while the secondary winding generates the turn-off pulses. As before, a third winding for excess energy recovery can be provided.

DESCRIPTION OF THE PREFERRED EMBODIMENTS

Figures 1, 2, 3A, 3B, 3C, 3D:
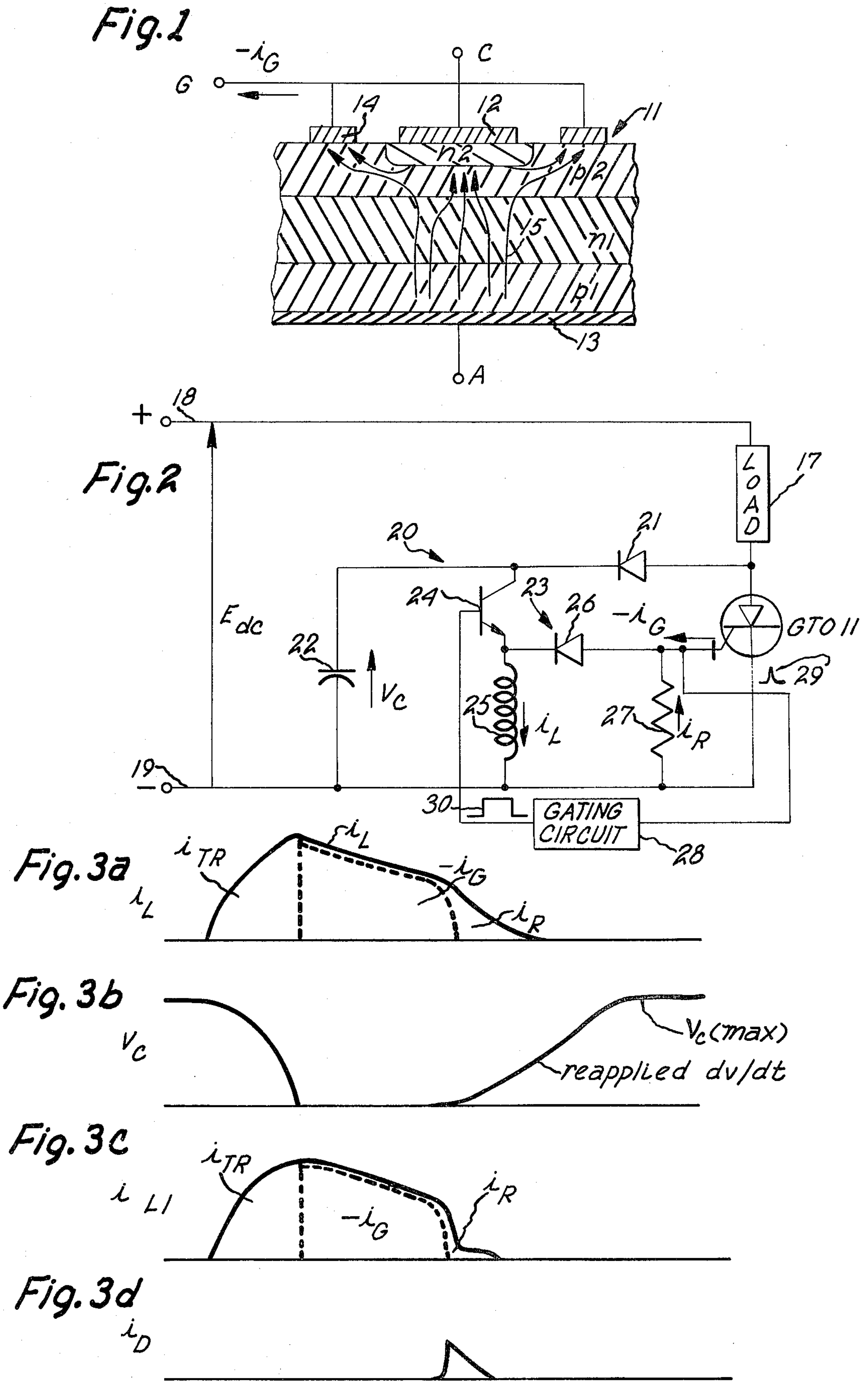
FIG. 1 is a fragmentary schematic cross section through an interdigitated gate turn-off thyristor.
FIGS. 2 and 4 are schematic circuit diagrams of a GTO chopper circuit provided with a turn-off circuit for generating reverse gate pulses or turn-off pulses using the stored snubber circuit energy, with the modification in FIG. 4 of an added circuit to return excess energy to the supply.
FIGS. 3*a*–3*d* are waveform diagrams of the currents and voltage produced in selected snubber and turn-off circuit components during operation of the FIG. 2 and FIG. 4 circuits, the time scale being expanded to illustrate generation of the reverse gate pulse.

The power gate turn-off thyristor 11 shown in FIG. 1 is a four-layer silicon pnpn switch with an interdigitated structure of the type described, for instance, in U.S. Pat. 3,609,476 to H. F. Storm, granted Sept. 28, 1971, and assigned to the same assignee. Within its broader scope, the invention applies to lower power devices without interdigitation, as well as to pnp and npn power transistors and similar appropriate power semiconductors. In the device illustrated, the outer semiconductor layers on which the cathode contact stripes 12 and the anode contact 13 are respectively deposited are known as the *n*2-emitter layer and the *p*1-emitter layer, while the inner semiconductor layers are known as the *p*2-base layer and the *n*1-base layer. The gate contact stripes 14 are deposited on the *p*2-base layer at either side of the emitter stripes and are interdigitated with the cathode contact stripes 12. It is desirable to review briefly the distinctive features of the turn-off mechanism in a GTO device when a reverse gate pulse is applied to the gate or control terminal G. The main effect to be observed is the squeezing of the current density lines 15 under the *n*2-emitter due to the lateral voltage drop in the *p*2-base which is caused by the reverse gate current $-i_G$ being withdrawn from the gate terminal. The regions immediately adjacent to the gate contacts 14 are the first to be non-conducting, and as current is squeezed toward the center of the emitter, turn-off begins at the edge of the emitter and proceeds inwardly as the current density increases at and near the center of the emitter. During this time interval which may constitute a major portion of the semiconductor storage time, the anode current is still constant since the center portion of the emitter is still conducting. When the conducting region is squeezed to a small enough dimension, the device turns off in a one-dimensional manner as the regenerative processes are interrupted. In the following discussion, the anode terminal A and the cathode terminal C are also referred to as the load terminals.

In the d-c to d-c GTO chopper circuit of FIG. 2 used by way of example to explain the invention, GTO 11 is connected in series with a load 17 between a pair of input voltage supply lines 18 and 19 between which is applied the energizing voltage $E_{dc}$. The device symbol used for the GTO is an encircled conventional thyristor symbol with a vertical bar at the gate lead to indicate gate turn-off capability. A polarized snubber circuit indicated generally at 20 is connected directly between the load terminals of GTO device 11, preferably mounted close to the device so as to provide a low inductance path. Snubber circuit 20 is comprised by the series combination of a semiconductor diode 21 or other rectifier and a snubber capacitor 22. The inclusion of a series snubber resistor is not precluded but is not desirable in this snubber circuit because of the resultant increase in GTO turn-off dissipation. In a high frequency chopper circuit, such as is being described, diode 21 is selected to have fast turn-on characteristics. As GTO 11 switches from the low impedance conducting state to the high impedance blocking state after the application of a reverse gate pulse, load current is partially diverted from the GTO device to snubber diode 21 and charges snubber capacitor 22 toward a voltage $V_c$(max) with a polarity as indicated, thereby reducing power dissipation and limiting reapplied dv/dt. In accordance with the invention, the stored snubber capacitor energy is recovered by a suitably constructed turn-off circuit and utilized to generate the reverse gate pulses or turn-off control current pulses employed to achieve switching of GTO 11 to the non-conducting state. The turn-off circuit indicated generally at 23 is comprised by a transistor 24 or other controlled solid state device connected in series with an inductor 25 across the snubber capacitor 22 and forming therewith a series resonant circuit. To complete the turn-off circuit in its simplest version, a blocking diode 26 is connected between the gate or control terminal of GTO 11 and the junction of transistor 24 and storage inductor 25, and an impedance such as resistor 27 is connected between the gate and cathode of GTO 11. A suitable gating circuit 28 supplies periodically timed turn-on gate pulses 29 to GTO 11 and also provides timed base drive signals 30 to transistor 24 to initiate the generation of the turn-off pulses. Inductor 25 in this circuit functions as an inductive energy storage means and in other embodiments takes the form of a transformer as will be described presently.

While GTO 11 is in the conducting state, snubber circuit energy from a previous cycle of operation is stored in the snubber capacitor 22 and trapped by the reverse biased snubber diode 21. Upon initial start-up, snubber capacitor 22 charges through the diode to the value of the supply voltage and in like manner the energy is trapped when the GTO is initially rendered conductive. Having reference also to the waveform diagrams of FIGS. 3*a* and 3*b*, the generation of a turn-off pulse is initiated by rendering conductive the control transistor 24 for an interval equal to one-fourth the natural period of the series LC circuit comprised by snubber capacitor 22 and inductor 25. At the end of the quarter cycle, the stored snubber capacitor energy is transferred to the inductor 25. It may be desirable to terminate the timed base drive signal 30 and thus render transistor 24 non-conductive slightly in advance of the complete quarter cycle so as to retain sufficient snubber capacitor voltage to keep the snubber diode 21 reverse biased and assure that load current is not transferred to transistor 24 before the generation of the reverse gate pulse. In either case, the snubber capacitor voltage is at or near zero ready to perform its snubber circuit function of limiting reapplied *dv/dt*. The current flowing through transistor 24 used to charge the inductor 25 is identified in the waveform diagrams as $i_{TR}$. It will be noted that the switching duty of transistor 24 at turn-on and also at turn-off is relatively light.

Transistor 24 having been turned off, the current in inductor 25 cannot change instantaneously and continues to flow in the same direction. As the stored energy discharges and there is a change in voltage across inductor 25, blocking diode 26 is forward biased and completes a low impedance path for the discharge current $i_L$ through the emitter-base junction of GTO 11 which is still conducting. Thus, the reverse gate current pulse $-i_G$ is generated. During the storage time interval, a small amount of current $i_R$ is diverted through the higher impedance gate-cathode resistor 27, and this is evident in FIG. 3*a* wherein the inductive discharge current $i_L$ is shown as having two components. At the end of the storage time interval, GTO 11 begins to turn off and there is a fast falling reduction in the current $-i_G$ and corresponding increase in the current $i_R$. Once the emitter-base junction of the GTO recovers, the current $i_L$ which is still flowing is diverted almost completely to the resistor 27. Hence, excess turn-off pulse energy is dissipated in resistor 27 and the inductive discharge current falls to zero. In FIG. 3*a*, the time scale for decay of the inductive discharge current $i_L$ is expanded as compared to the time scale for the charging current $i_{TR}$ to facilitate explanation of the turn-off mechanism. As the GTO device switches from the conducting state to the non-conducting state in which voltage is blocked, snubber capacitor 22 is recharged through diode 21 to its original voltage $V_c$(max). As is illustrated in FIG. 3*b*, this slowly rising capacitor voltage limits the reapplied *dv/dt*.

Figure 4:
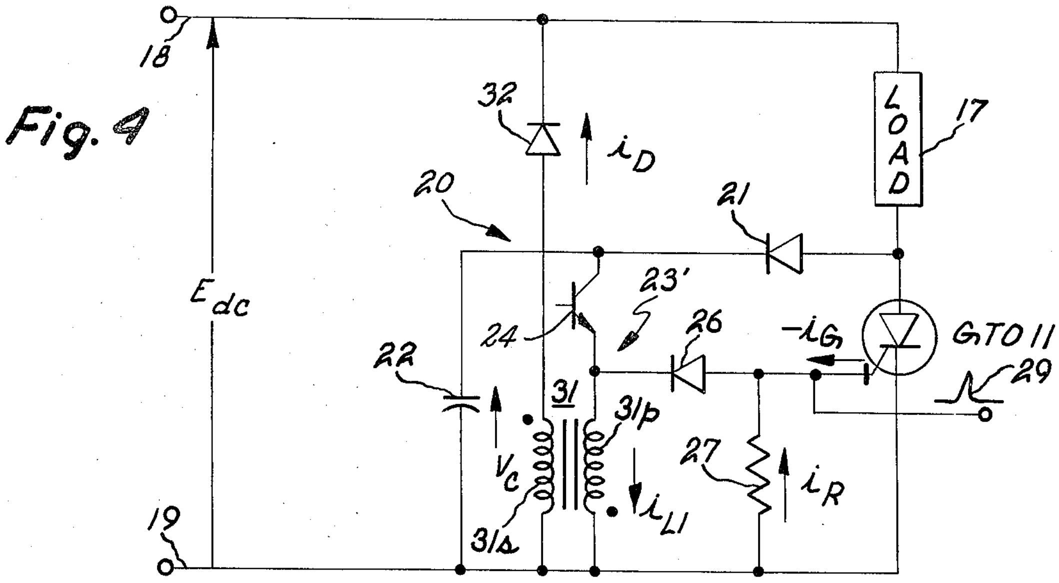

To prevent the cathode-gate voltage from rising high enough to cause avalanching, it may be necessary to clamp the emitter-base junction of the GTO to a predetermined negative voltage level using a separate clamping power supply. A more desirable technique for accomplishing this function is shown in FIG. 4, which is a modification of the FIG. 2 circuit. In the modified turn-off circuit 23', the inductive energy storage means takes the form of a transformer 31 wherein the primary winding 31*p* is connected in the same manner as the simple inductor 25 in FIG. 2. The secondary winding 31*s* is connected in series with a diode 32 and connected between the d-c supply lines 18 and 19 to return excess energy to the supply. The polarity of the transformer windings is indicated by the dots. When GTO 11 switches to the high impedance condition and the discharge current $i_{L1}$ in primary winding 31*p* is diverted to the resistor 27, the voltage across the winding 31*p* rises. At a level determined by the turns ratio of the transformer windings, diode 32 becomes conductive and returns energy to the supply. Comparing FIG. 3*c* with FIG. 3*a*, it is seen that the current $i_R$ falls to lower values as diode 32 conducts the current $i_D$ (FIG. 3*d*). Of course, the excess energy can be returned to any other selected supply such as a gating circuit supply.

A particular advantage of the new turn-off circuits herein described is that the single snubber capacitor 22 has multiple functions, namely, to supply energy for generating the turn-off pulses, limit the rate of rise of voltage applied to the GTO device 11, and limit the rate of rise of voltage applied to the turn-off circuit and the transistor or other controlled solid state device 24. In place of the transistor 24, another GTO device or SCR can be used in appropriate circuits. The inherent operation of the circuit with many inductive loads is that the voltage to which snubber capacitor 22 is charged is a function of the load current, with the desirable result that the magnitude of the turn-off control current pulses increases or decreases as the load current is correspondingly raised or lowered. In those cases where a *di/dt* limiting inductance is in series with the load (not here illustrated), the voltage to which the snubber capacitor charges will overshoot as the power device is rendered non-conductive and the inductance discharges. Consequently, as the load current increases, the final voltage on capacitor 22 becomes higher and provides the larger amount of stored snubber circuit energy used to generate the larger turn-off pulses. Moreover, as the load current increases or decreases gradually over several cycles, the turn-off pulses change in corresponding fashion to provide efficient circuit operation due to the absence of unnecessarily high turn-off pulses. With the addition of the feature of returning excess snubber circuit energy to the supply, efficient operation of the entire turn-off circuit is further promoted. In FIG. 4 it is noted that a good resetting voltage is available to reset the core of transformer 31 so that reasonably high frequency operation is possible. This resetting voltage is present during the discharge of the current $i_{L1}$ as previously described, and depends on the maximum allowable voltage that can be applied to the emitter-base junction of GTO 11. Also, with this turn-off circuit arrangement the need to provide a separate high current source is obviated.

Figure 5:
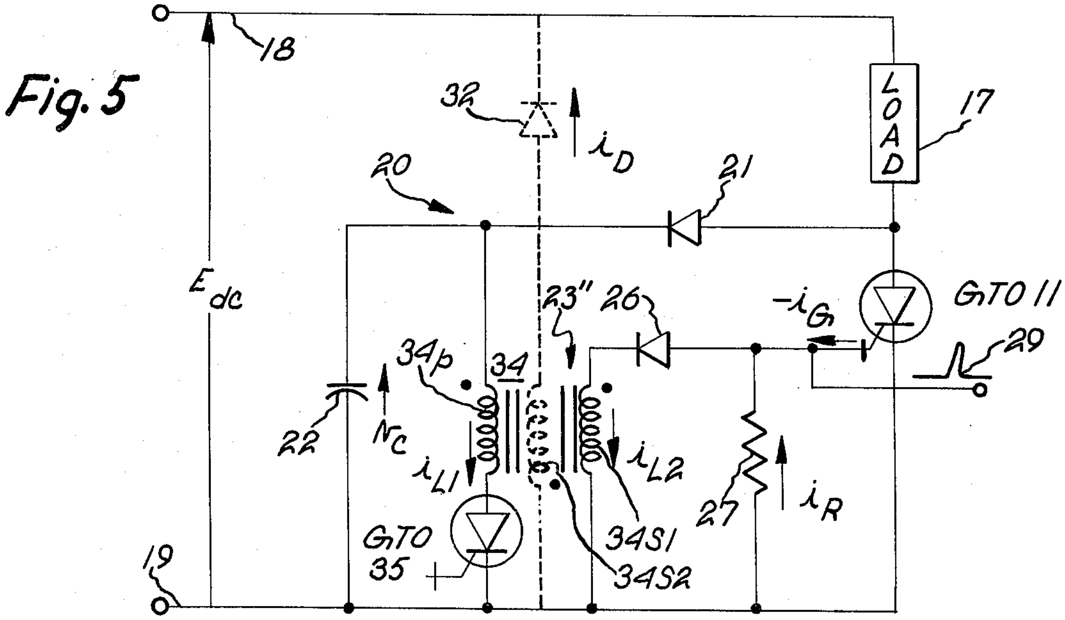
FIG. 5 is a circuit diagram of another embodiment of the GTO chopper using a transformer in the turn-off circuit to transfer recovered snubber energy to the secondary to produce the turn-off pulse, showing in dotted lines the option of a third winding to return excess energy to the supply.

FIG. 5 shows another embodiment of the invention using a GTO device in the turn-off circuit and a transformer to recover the snubber circuit energy and transfer it to a secondary circuit for generating the turn-off control current pulse. Optionally, the excess energy is returned to the d-c supply or another available supply. In the turn-off circuit 23'', whose operation is explained with regard to the waveform diagrams given in FIGS. 6*a*–6*e*, the primary winding 34*p* of a transformer 34 is connected in series with a lower power GTO device 35 whose cathode is common with the cathode of power GTO 11, which may be desirable for some applications. The secondary winding 34*s*1 is connected in series with the blocking diode 26 between the gate and cathode of GTO 11. As in the previous circuits, GTO 35 is rendered conductive for a quarter cycle of the resonant frequency, generating the current $i_{L1}$ which is transferred to the secondary winding to subsequently produce the discharge current $i_{L2}$. Impedance matching is possible using two windings in this manner, since the peak primary circuit current $I_m$ is transferred to the secondary circuit in accordance with the turns ratio N1/N2. Thus, the peak reverse gate current $-i_G$ can be different from the peak current $i_{L1}$ generated when the snubber circuit energy is recovered. The transformer 34 can have a third winding 34*s*2 connected as before in series with the diode 32 to return excess energy to the d-c supply while clamping the maximum cathode-gate voltage of GTO 11 to a predetermined level.

Figure 8:
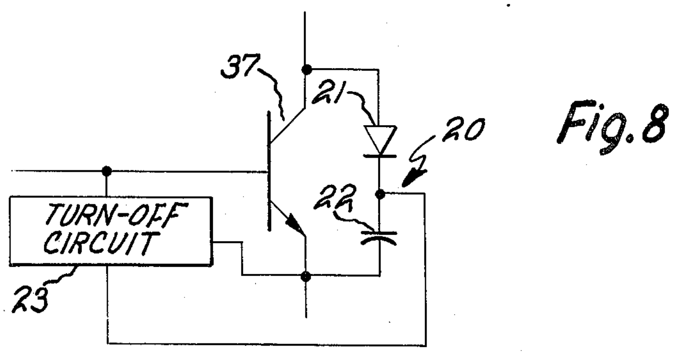
FIG. 8 illustrates a power transistor with a snubber energized turn-off circuit as herein taught.
Figures 6A, 6B, 6C, 6D, 6E:
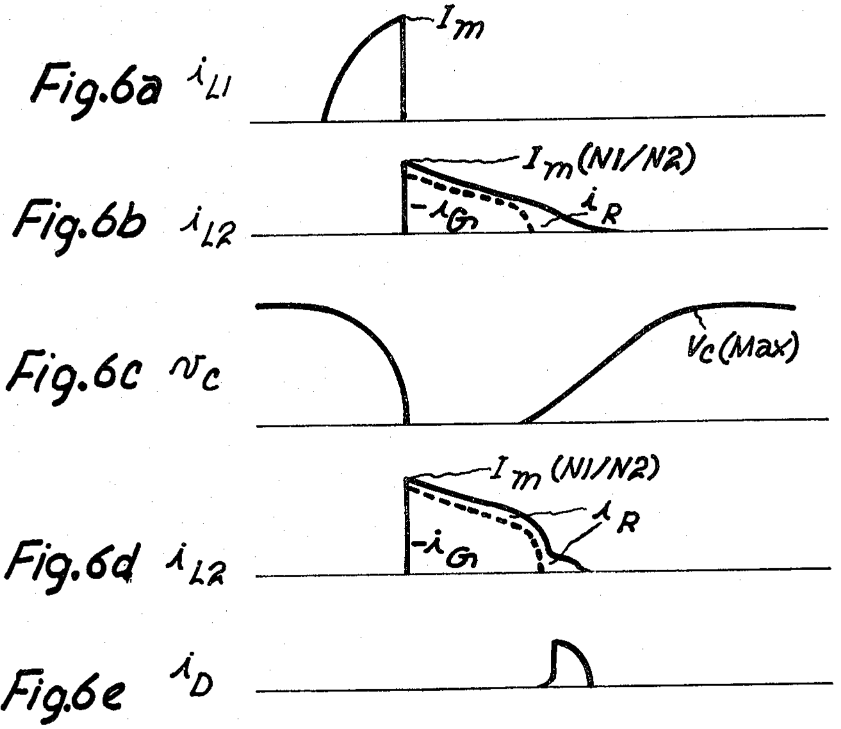
FIGS. 6*a*–6*e* are selected current and voltage waveform diagrams useful in explaining the operation of the FIG. 5 circuit, with a partially expanded time scale as in FIGS. 3*a*–3*d;*
Figure 7:
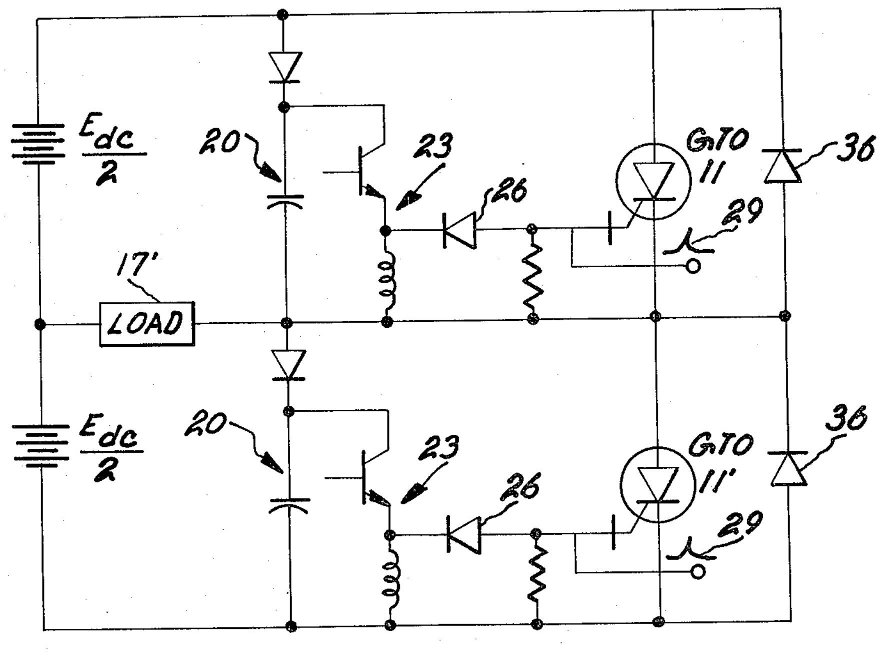
FIG. 7 is a schematic circuit diagram of an inverter utilizing the basic GTO turn-off circuit shown in FIG. 2.

In addition to the chopper circuit, the new turn-off circuit for recovering and utilizing the snubber circuit energy is useful in a variety of other power circuits such as the half-bridge configuration inverter shown in FIG. 7. As is conventional, the load 17' is connected to the center tap of a center tapped d-c supply and to the junction of a pair of GTO devices 11 and 11' which are rendered conductive alternately to supply alternating voltage to the load. Each GTO device is provided with a polarized snubber circuit 20 and a turn-off circuit 23 of the type shown in FIG. 2. A feedback diode 36 is connected across the load terminals of each device to facilitate operation with a lagging power factor load as known in the art. Instead of rendering the GTO conductive by pulse firing using turn-on pulse 29, d-c firing may be desirable for some applications in which case a Zener diode is connected in series with the blocking diode 26 (with anodes connected) to assure that the turn-on current flows into the gate of the GTO device. FIG. 8 illustrates the application of the new turn-off circuit to a power transistor, which can also be used in a variety of power circuits. The polarized snubber circuit 20 is connected between the collector and emitter, or load terminals, of the npn power transistor 37 and is provided for the same reasons and functions in the same manner as when used with a GTO device. The turn-off circuit 23 connected across the snubber capacitor 22 supplies a turn-off pulse to the base or control terminal of the transistor to facilitate switching to the non-conducting state and to assure that it remains in the non-conducting state blocking voltage. The switching duty of the transistor, it is noted, is relatively light both at turn-on and turn-off. Of course, the various modifications of the basic turn-off circuit shown in FIGS. 4 and 5 can be employed in either FIG. 7 or FIG. 8.

In summary, highly efficient and economical circuit operation especially suitable for high frequency power conversion is achieved by the combination of a snubber-energized turn-off circuit with a semiconductor device of the type having a pair of load terminals and a control current terminal. The single snubber capacitor in the polarized snubber circuit has multiple functions and for some loads the circuit operates to supply variable magnitude turn-off pulses depending on the amount of load current, with optional provision for returning excess energy to a supply.

While the invention has been particularly shown and described with reference to several preferred embodiments thereof, it will be understood by those skilled in the art that various changes in form and details may be made therein without departing from the spirit and scope of the invention.

The invention claimed is:

1. A semiconductor device turn-off circuit comprising a power semiconductor device having a pair of load terminals and a control terminal for controlling switching of said device between a conducting state and a non-conducting state blocking voltage, a polarized snubber circuit comprising a series-connected snubber diode and snubber capacitor connected between said load terminals and operative to store energy in said snubber capacitor as the rate of rise of voltage across said device is limited, and a turn-off circuit for selectively utilizing said stored snubber capacitor energy to generate a turn-off control current pulse to achieve switching of said device to the nonconducting state, said turn-off circuit comprising a controlled solid state switch and inductive energy storage means connected across said snubber capacitor to form a series resonant circuit, means for rendering conductive said controlled solid state switch for a predetermined interval to transfer said stored energy to said inductive energy storage means, said inductive energy storage means and a series-connected blocking diode being coupled between said control terminal and one load terminal such that discharge of said inductive energy storage means forward biases said blocking diode and generates said turn-off pulse, and an impedance connected between said control terminal and one load terminal for circulating excess energy.

2. The combination according to claim 1 wherein said inductive energy storage means is an inductor, and said blocking diode is connected between said inductor and said control terminal.

3. The combination according to claim 1 wherein said semiconductor device is connected in a power circuit between a pair of supply lines, and said inductive energy storage means is a transformer having a primary winding in series with said controlled solid state switch and snubber capacitor, said blocking diode further being connected between said primary winding and control terminal, said transformer having a magnetically coupled secondary winding connected in series with a diode between said supply lines to return a portion of the excess energy to the supply.

4. The combination according to claim 1 wherein said inductive energy storage means is a transformer having magnetically coupled primary and secondary windings, and said primary winding is connected in series with said controlled switch device and snubber capacitor, said blocking diode and secondary winding being connected between said control terminal and one load terminal.

5. The combination according to claim 4 wherein said semiconductor device is connected in a power circuit between a pair of supply lines, and said transformer has a magnetically coupled third winding connected in series with a diode between said supply lines to return a portion of said excess energy to the supply.

6. A turn-off circuit for a gate turn-off thyristor comprising a gate turn-off thyristor device having anode and cathode terminals and a gate terminal for controlling switching of said device between a conducting state and a non-conducting state blocking voltage, a polarized snubber circuit comprising a series-connected snubber diode and snubber capacitor connected between said anode and cathode terminals and operative to store energy in said snubber capacitor as the rate of rise of voltage across said device is limited upon switching to the non-conducting state, said snubber diode having a polarity to be reverse biased and trap the stored energy upon switching of said device to the conducting state, and a turn-off circuit for selectively utilizing said stored snubber capacitor energy to generate a turn-off current pulse, said turn-off circuit comprising a controlled solid state device and inductive energy storage means connected across said snubber capacitor to form a series resonant circuit, means for rendering conductive said controlled solid state switch for a predetermined interval to transfer said stored energy to said inductive energy storage means, said inductive energy storage means and a series-connected blocking diode being coupled between said gate and cathode terminals such that discharge of said inductive energy storage means forward biases said blocking diode and generates said turn-off current pulse to achieve switching of said device to the non-conducting state.

* * * * *